United States Patent
Ishida et al.

(10) Patent No.: US 6,960,007 B2
(45) Date of Patent: Nov. 1, 2005

(54) VEHICULAR HEADLAMP USING SEMICONDUCTOR LIGHT-EMITTING ELEMENTS AND MANUFACTURING METHOD THEREOF

(75) Inventors: Hiroyuki Ishida, Shizuoka (JP); Kiyoshi Sazuka, Shizuoka (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 101 days.

(21) Appl. No.: 10/699,732

(22) Filed: Nov. 4, 2003

(65) Prior Publication Data

US 2004/0090790 A1 May 13, 2004

(30) Foreign Application Priority Data

Nov. 6, 2002 (JP) ..................................... P. 2002-322652

(51) Int. Cl.[7] .................................................. B60Q 1/08
(52) U.S. Cl. ......................... 362/538; 362/545; 362/84; 362/507
(58) Field of Search ................................. 362/507, 509, 362/84, 545, 538, 512; 313/502

(56) References Cited

U.S. PATENT DOCUMENTS 5,998,925 A * 12/1999 Shimizu et al. ............. 313/503
6,565,247 B2    5/2003 Thominet
6,661,030 B2 * 12/2003 Komoto et al. ............... 257/98

* cited by examiner

Primary Examiner—Ali Alavi
(74) Attorney, Agent, or Firm—Sughrue Mion, PLLC

(57) ABSTRACT

A vehicular headlamp in which a light-emitting element such as an LED is used as a light source and which has a light distribution with good accuracy. The headlamp includes a semiconductor light-emitting element in the form of a semiconductor chip and an optical system including a reflector and a lens with a fluorescent body arranged around the semiconductor chip. The focal point of the optical system is located on or closely adjacent the semiconductor chip constituting the light-emitting portion of the light-emitting element in which. Dimensional errors in the outer shape of the reflector or the fluorescent body are made to be not more than 0.1 millimeters, that is, smaller than the positional error of the light-emitting portion with respect to the reflector or the lens. The dimensional accuracy of the semiconductor chip and the like are improved, and thus accuracy required for light distribution control sufficiently assured.

7 Claims, 12 Drawing Sheets

VEHICULAR HEADLAMP USING SEMICONDUCTOR LIGHT-EMITTING ELEMENTS AND MANUFACTURING METHOD THEREOF

CROSS-REFERENCE TO RELATED APPLICATIONS

Not applicable

STATEMENT REGARDING FEDERALLY SPONSORED RESEARCH OR DEVELOPMENT

Not applicable

REFERENCE TO SEQUENCE LISTING, A TABLE, OR A COMPUTER PROGRAM LISTING COMPACT DISK APPENDIX

Not applicable

BACKGROUND OF THE INVENTION

The present invention relates to a vehicular headlamp in which a semiconductor light-emitting element such as a light-emitting diode or the like is used as a light source, as well as to a method for manufacturing such a headlamp.

An incandescent bulb or a discharge bulb has commonly been used as a light source of a vehicular lamp. More recently, a light-emitting element such as a light-emitting diode (LED) in which a semiconductor is used has been investigated for the purposes of reducing electric power consumption, reducing the size of the lamp, and the like.

For example, a high-mount stop lamp, a rear side marker lamp or the like are as examples of lamps in which an LED light source is used.

Special optical design techniques are required in order to create a low-beam light distribution pattern if a light-emitting element such as an LED is employed as a light source of a vehicular headlamp. For example, a lamp structure is known in which switching is allowed for various illuminating functions by way of a plurality of semiconductor light sources which are arranged in a matrix and selectively activated as required for a given function. (For example, refer to Japanese Laid-Open Application Publication No. 2001-266620, particularly FIGS. 1 and 4.)

In a vehicular headlamp, however, positional accuracy of optical components is important because a light-emitting element and component parts of the optical system are at a close distance. In a conventional light-emitting element, however, often the positional accuracy of thesemiconductor chip of the light-emitting element with respect to the reflector or lens of the optical system is sufficiently low as to have a significant adverse effect on the formation of the headlamp light distribution. In a low-beam light distribution pattern, for example, it becomes difficult to form consistently and accurately a clear cut line or a cut-off line which define a contrast boundary.

BRIEF SUMMARY OF THE INVENTION

Therefore, an object of the present invention is to enable consistently accurate design of the light distribution of a vehicular headlamp in which a light-emitting element such as an LED is used as the light source.

A vehicular headlamp according to the present invention is provided with an optical system including a semiconductor light-emitting element, a reflector and a lens. The semiconductor chip constituting the light-emitting portion of the light-emitting element, on which a focal point related to the optical system is located, or a reflecting surface or a fluorescent body arranged around the semiconductor chip, has a positioned error of not more than 0.1 millimeters in an outer shape dimension when viewed in the direction of the optical axis of the light-emitting element, thus making the error smaller than the possible positional error of the light-emitting portion with respect to the reflector or the lens.

Accordingly, with the present invention, the dimensional accuracy of the semiconductor chip or the like is increased compared with the positional accuracy of the light-emitting portion with respect to the reflector or the lens, and thus the accuracy required for light distribution control is sufficiently assured.

DETAILED DESCRIPTION OF THE INVENTION

The present invention relates to a vehicular headlamp in which a semiconductor light-emitting element is used as a light source. The present invention can be applied to a headlamp, a fog lamp and the like. Light-emitting elements in which a semiconductor is used include, for example, an LED which emits light when a forward current is applied to a pn junction, an EL element which emits light upon application of an electric field, and the like.

Figure 1:
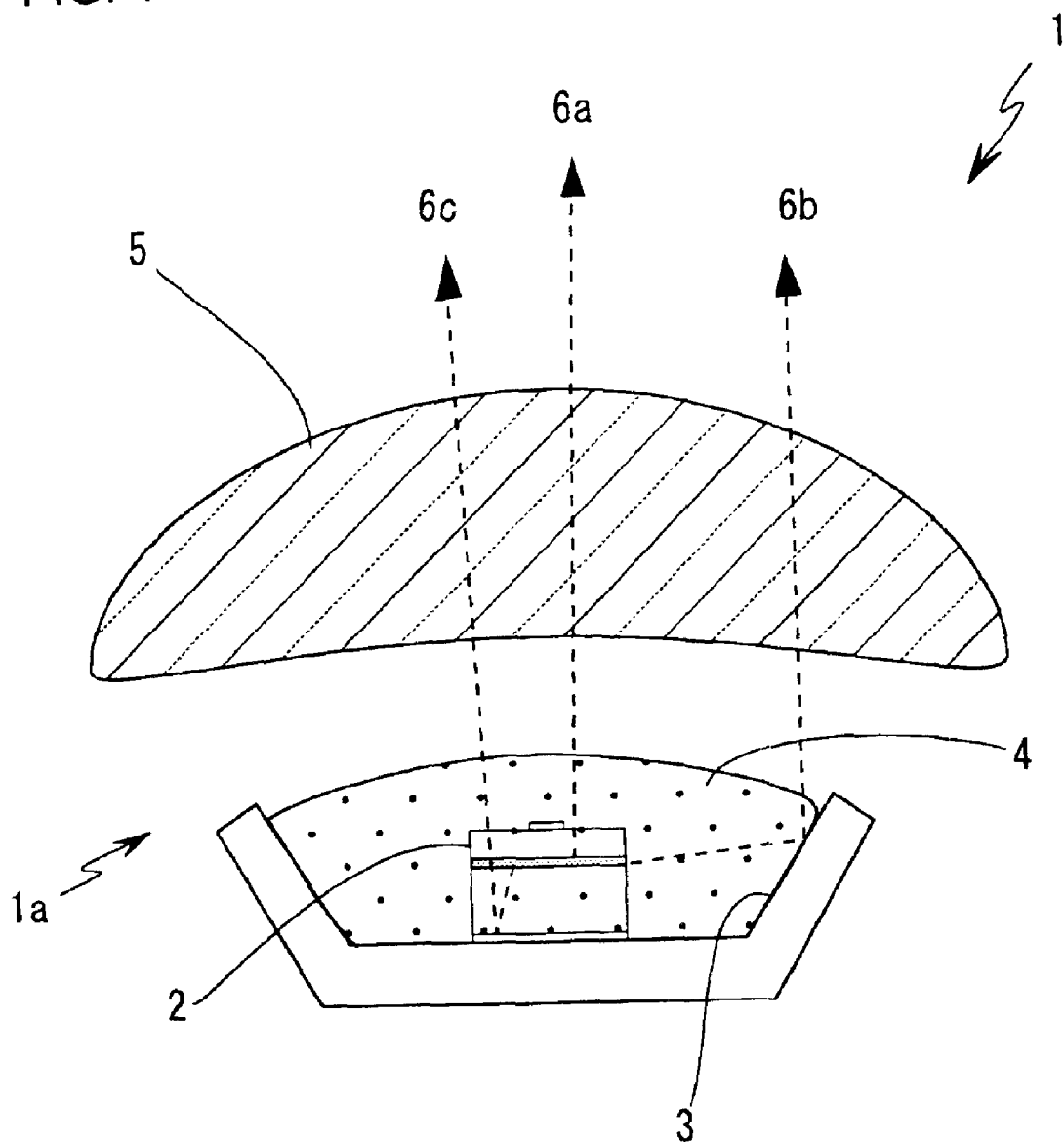
FIG. 1 is an explanatory drawing showing an example of the structure of a light-emitting element of a type which can be used with the invention.

FIG. 1 schematically shows, as an example, the structure of a light-emitting element 1 in a case where an LED is used as the light source.

The light-emitting element 1 is provided with a semiconductor chip 2, a reflector 3, a fluorescent body 4, and a lens 5. In this example, a light-emitting portion 1a is includes the semiconductor chip 2, the reflector 3, and the fluorescent body 4. The focal point of the optical system is located at the surface of the light-emitting portion or at a position closely adjacent thereto. The term "focal point" as used herein is not limited to a focal point in a narrow sense related to a reflector or a lens, but includes a data point or the like for optical shape design.

An Al—In—Ga—P system material, an In—Ga—N system material, or the like is used for the semiconductor chip 2. The semiconductor chip 2 may be directly mounted on a supporting member (a lead frame, stem, or the like), or the semiconductor chip may be mounted on a sub mounting member and then that member is mounted on the supporting member. Bonding wires (not shown) are connected to the electrodes of the semiconductor chip 2.

The reflector 3 is provided around the semiconductor chip 2. For example, the supporting member of the semiconductor chip 2 may have a cup-shaped portion on which a concave face is formed, thus forming a reflecting surface. Light generated in the semiconductor chip 2 has an orientation characteristic in which the optical axis of the light-emitting element 1 serves as the center. Accordingly, the light intensity is reduced as angular distance from the optical axis increases. Therefore, the direct light 6a in the direction of the optical axis is generally greater in intensity than the reflected light 6b and 6c. However, the reflector 3 is provided for making effective use of light such as the reflected light 6b which is emitted from the semiconductor chip 2 and directed laterally. In other words, light reflected by the reflecting surface of the reflector 3 becomes light directed to the front (illumination direction). The reflected light 6c is light emitted from a light-emitting layer directed laterally in a direction opposite to the illumination direction. This light becomes light directed to the front upon being reflected by the rear end face of the semiconductor chip 2, and is subsequently emitted from a side face of the semiconductor chip 2 and reflected by the reflector 3.

The fluorescent body 4 covers the semiconductor chip 2 and the surrounding space. White light, for example, can be produced by mixing colors using a blue-light-emitting semiconductor chip and a yellow-light-emitting material such as a YAG fluorescent body.

The lens 5 is provided in front of the light-emitting portion 1a. The light-emitting portion 1a can be enveloped in a plastic lens. A preferred orientation characteristic can be obtained by enveloping the entire light-emitting portion in plastic. For example, a bullet-shaped structure can be used for a stop lamp or the like. A dome-shaped or hemispheric lens is preferable in order to prevent light radiated from the semiconductor chip 2 over a wide angle from being reflected within the lens or from being lost by being emitted from a side face portion of the lens. Furthermore, it is preferable to raise the light utilization efficiency by effective light path control wherein the reflector directs substantially all of the radiated light from the semiconductor chip in the desired illumination direction.

In a light-emitting element in which the light source image of the light-emitting portion has a circular shape when viewed in the direction of the optical axis of the light-emitting element, light generated within the light-emitting portion includes direct light as a major part thereof, which contributes to formation of a circular pattern, and a ring-shaped pattern around the periphery of the circular pattern is formed by light emitted from a side face of the lens, which acts as a pseudo light source.

In this manner, in a case where the light intensity distribution of the light source is rotationally symmetric around the optical axis, optical design is difficult because a rotationally asymmetric light distribution pattern must be formed based on a pattern which is substantially circular when viewed in the direction of the optical axis. For example, a straight portion such as a cut line in a low-beam light distribution is difficult to form due to the fact that it is difficult to form a clear straight portion only by connecting arc-shaped portions.

Therefore, in a case where the light intensity distribution of the light-emitting element is rotationally asymmetric around the optical axis, a structure is provided such that the light-emitting portion has a horizontally elongated shape in a direction orthogonal to the optical axis of the light-emitting element, whereby the image projected through the optical system has a pattern including a straight portion.

Figure 2:
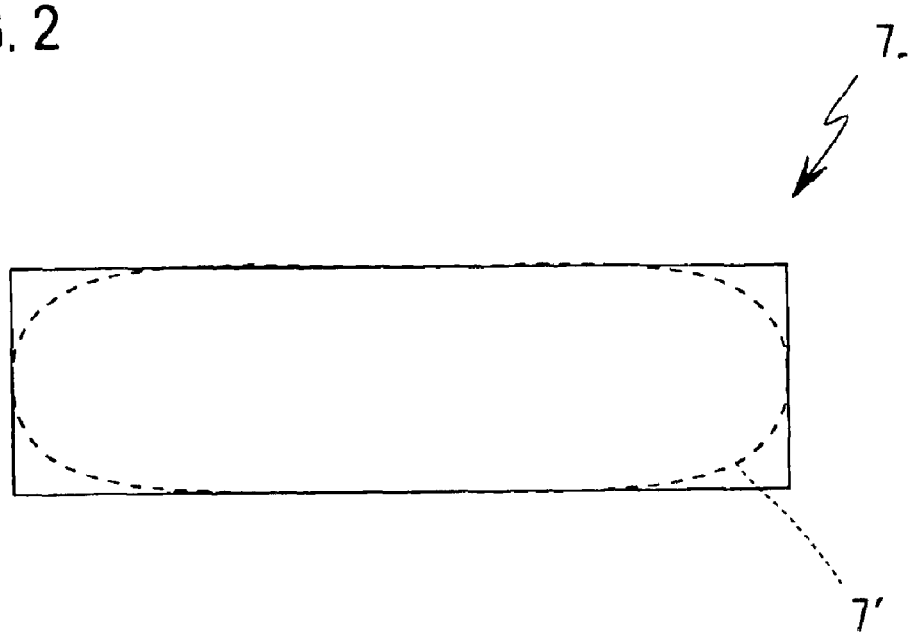
FIG. 2 shows schematically an example of a rectangular illumination pattern related to the light-emitting element.

FIG. 2 schematically shows an example of the pattern shape of a light source associated with the light-emitting element viewed in the direction of the optical axis of the light-emitting element.

This example shows the pattern shape of a light source image 7 in which the outer periphery is generally rectangular.

In this example, the light-emitting portion 1a has a rectangular shape when viewed in the direction of the optical axis. The light source image is enlarged mainly in the longitudinal direction, as will be described in more detail later.

It is preferable for the light-emitting portion to have a rectangular shape so as to obtain a projected pattern which is horizontally elongated. However, the shape of the end portion in the longitudinal direction is not limited to a straight shape. For example, for a light source image as shown by a dashed line 7', a shape may be obtained where the four corners of the rectangle are smoothly rounded off.

In order to obtain the light source image as described above, the shape of the semiconductor chip, the reflector, the fluorescent body, or the lens, which constitute the light-emitting element, may be made rotationally asymmetric around the optical axis of the light-emitting element. In other words, factors which determine the pattern shape of the light source image are the shape of the semiconductor chip, the shape of the reflector and/or fluorescent body, the material and the shape of the lens, and the optical positional relationship of these component members. Accordingly, a light-emitting element having a desired light source image can be designed based on simulation results (light ray tracing and light intensity distribution) and employing combinations of the respective elements.

The factors which determine the shape of the light-emitting portion are principally the shape of the outer edge of the semiconductor chip and the shape of the outer periphery of the reflector and/or the fluorescent body. An adverse effect is caused in the light distribution pattern if deviations in dimensional errors thereof are significant.

Consequently, in accordance with the present invention, in order to reduce the dimensional errors in the outer shape of the light-emitting portion, the dimensional errors in the outer shape related to the semiconductor chip and the reflector or fluorescent body are constrained to be not more than 0.1 mm. This value is subject to constraints in attachment accuracy and assembly accuracy of the light source. For example, in a light source such as an incandescent bulb in which a filament is used, an error within a range between approximately 0.2 to 1.5 mm has been tolerated with regard to the distance from an attachment data face to the light-emitting center of the bulb. The allowance of such a relatively large error as 1.5 mm is due to the fact that a positional error within the aforementioned range does not have a significant effect on the light distribution when the distance from the light-emitting center to the reflector or the like, or the focal distance, is comparatively long. However, the aforementioned error range cannot be tolerated if a semiconductor light-emitting element is used, and instead a value of less than 0.2 mm, or preferably, not more than 0.1 mm, should be adopted. However, it is extremely difficult in actuality and not realistic to make the dimensional error substantially zero as the required manufacturing accuracy becomes too strict and results in high manufacturing costs. Hence, it is sufficient that the dimensional error in the light-emitting portion is smaller than the positional error (usually larger than 0.1 mm) in the light-emitting portion with respect to the reflector or the lens which constitute the optical system.

Figure 3:
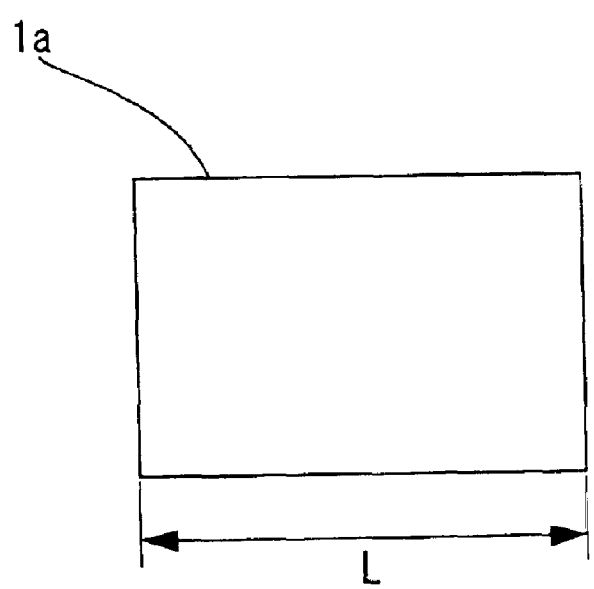
FIG. 3 is an explanatory drawing showing an example of the shape of a light-emitting portion when viewed from an optical axis direction.

FIG. 3 shows an example in which the light-emitting portion 1a has a rectangular shape when viewed in the direction of the optical axis of the light-emitting element, where "L" indicates the length of one of the sides.

L may, for example, be approximately 1 mm, and therefore the dimensional error in L should preferably be not more than L/10.

In a structure where the semiconductor chip of the light-emitting element when viewed in the direction of the optical axis has a designated shape and the semiconductor chip is covered by a molded plastic lens, it is effective in determining the shape of the reflector or the fluorescent body to consider various technical difficulties and disadvantages in manufacturing costs or the like involved in designing the semiconductor chip to a particular shape. In other words, the desired light intensity distribution should be achieved without adding significant costs to the manufacture of the semiconductor chip.

Figure 4:
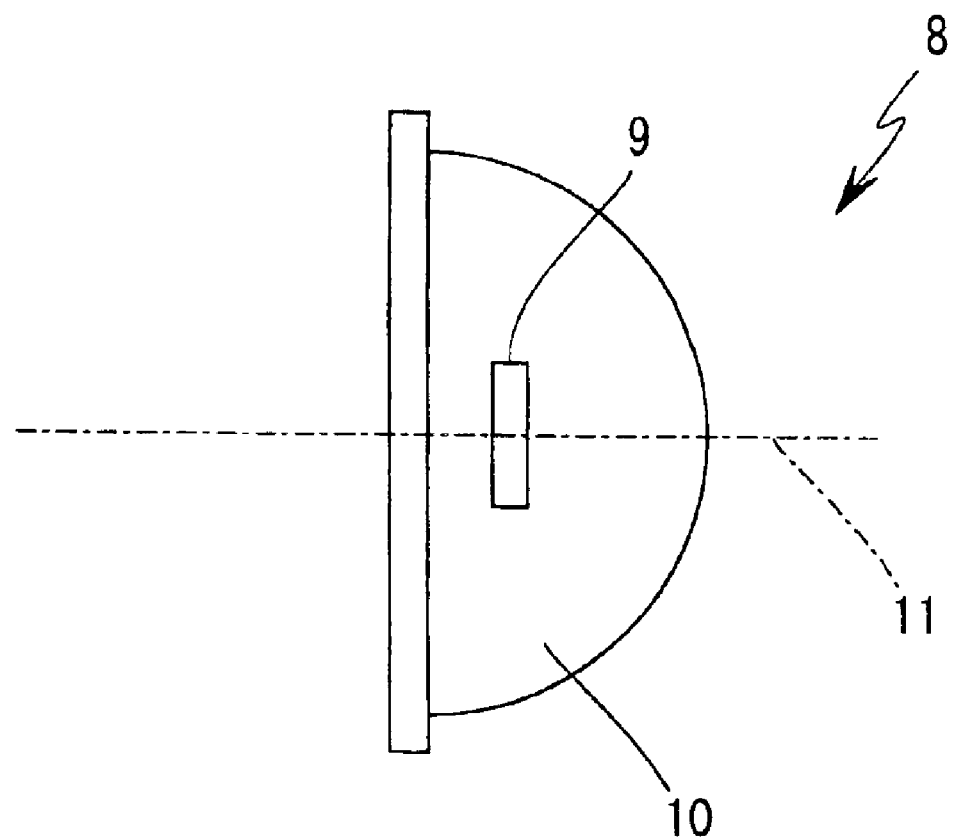
FIG. 4 is an explanatory drawing showing an LED when viewed from a side region.

As shown in FIG. 4, an LED 8 is structured such that a center portion of a semiconductor chip 9 thereof is positioned on the center axis 11 of a plastic lens 10. However, this may cause various problems in the headlamp light distribution.

For example, the center axis 11 of the plastic lens 10 is generally orthogonal to the optical axis of the optical system so that light from the LED 8 is reflected forward (in the illumination direction) by the reflector such that light for forming a low-beam light distribution pattern is produced. In this case, light generated at the peripheral portion of the semiconductor chip 9, away from the center portion thereof, is difficult to control because the amount of deviation from the center axis 11 is large. Since this light is difficult to control, it may be the cause of glare.

Consequently, the side edge of the light-emitting portion of the light-emitting element, when viewed in the direction of the optical axis, is formed so as to have a straight shape along one of the sides thereof. The position of the light-emitting portion is determined so as to be in alignment with the center axis of the lens.

Figure 5:
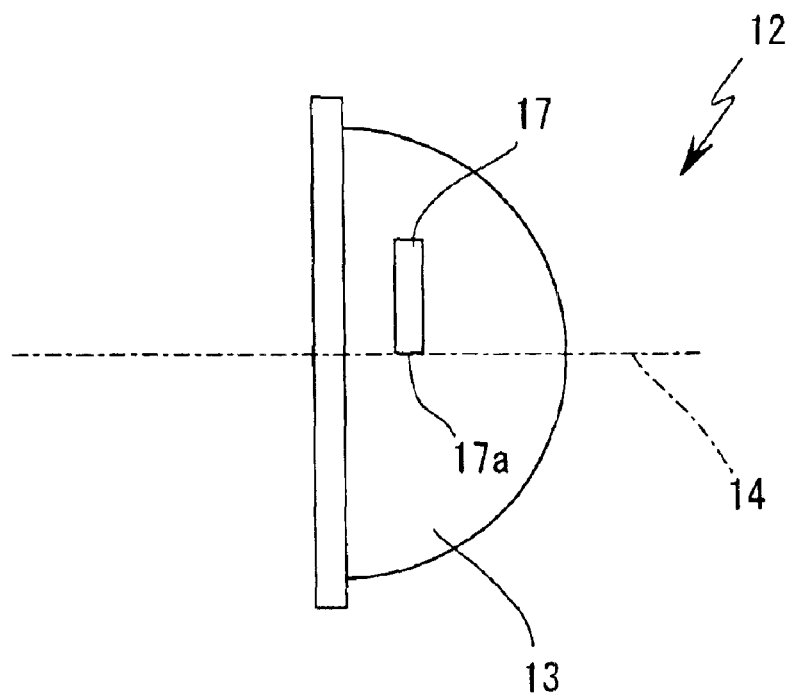
FIG. 5 shows an example of a light-emitting element which can be used in the present invention viewed from the side.
Figure 6:
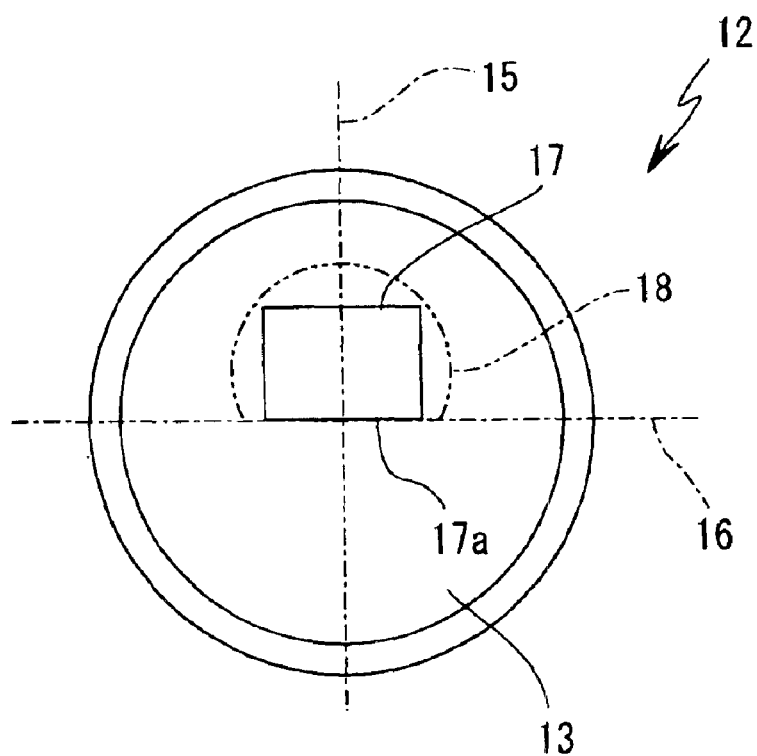
FIG. 6 shows the light-emitting element of FIG. 5 viewed in the direction of the optical axis.

FIG. 5 and FIG. 6 show an example 12 of a structure of the light-emitting element, of which FIG. 5 is a side elevational view and FIG. 6 is a front elevational view.

In FIG. 5, the center axis 14 of a lens 13 is shown as a single-dashed line. In FIG. 6, a vertical axis 15, which is orthogonal to the center axis 14 and passes through the center of the light-emitting portion, and a lateral axis 16, which is orthogonal to this axis, are shown as single-dashed lines.

In this example, a light-emitting portion 17 is rectangular when viewed in a front elevational view, and one side 17a thereof is in contact with the center axis 14 and the axis 16. It is to be noted that it is required to improve the dimensional accuracy of the light-emitting portion, as described above, in order to assure the accuracy in this positional relationship.

As indicated by a double-dashed line 18 in FIG. 6, the light-emitting portion, which has a circular shape partially cut off, may be, for example, created by designing the reflector so that one straight side thereof is in contact with the center axis 14 and the axis 16.

In this manner, the one side 17a of the light-emitting portion 17 (the semiconductor chip, the reflector and the like) is made straight and arranged so as to be in contact with the center axis 14 of the lens 13. Accordingly, light which is emitted from the portion 17 and passes through the lens 13 can thus be correctly controlled, and therefore light which causes glare can be reduced. In addition, a cut line in a low-beam light distribution pattern can be formed by using light obtained from this straight portion.

In a case where the light-emitting portion is rectangular when viewed in the direction of the optical axis of the light-emitting element, if the shape of the semiconductor chip and the like is square, the projected pattern has a shape symmetric with respect to the vertical axis and the horizontal axis, and thus the desired light distribution pattern is not easily obtained. In other words, since, in the desired light distribution of a headlamp, the spread of the pattern in the up-down (vertical) direction is comparatively narrow whereas the spread of the pattern in the right-left (horizontal) direction is large, it is not preferable to use a square-shaped projected pattern. This also applies to the formation of a cut line.

Therefore, the lamp is constructed such that the light-emitting portion is rectangular when viewed in the direction of the optical axis of the light-emitting element, whereby the desired light distribution can be easily obtained based on the projected pattern.

Figure 7:
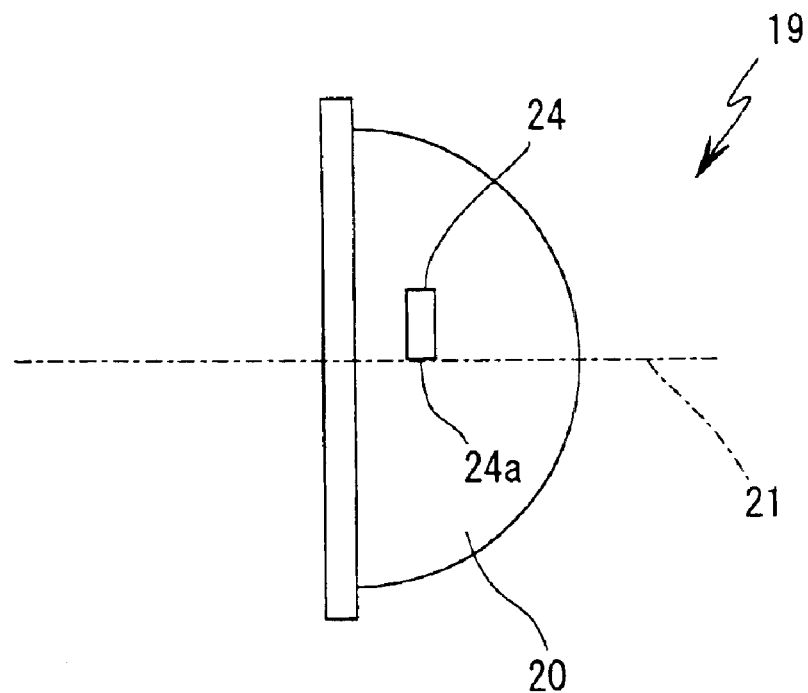
FIG. 7 shows another example of a light-emitting element which can be used in the present invention viewed the side.
Figure 8:
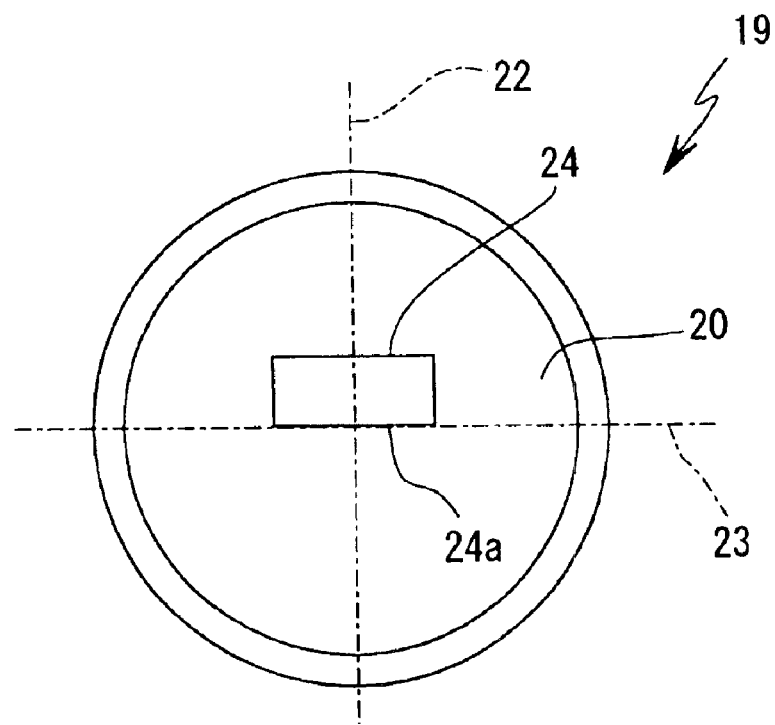
FIG. 8 shows the light-emitting element of FIG. 7 viewed in the direction of the optical axis.

FIG. 7 and FIG. 8 show an example 19 of the structure of a light-emitting element of the invention, of which FIG. 7 is a side elevational view and FIG. 8 is a front elevational view.

In FIG. 7, a center axis 21 of a lens 20 is indicated by a single-dashed line. In addition, in FIG. 8 a vertical axis 22, which is orthogonal to a center axis 21 and passes through the center of the light-emitting portion, and a lateral axis 23, which is orthogonal to this axis, are shown as single-dashed lines.

In this example, a light-emitting portion 24 is rectangular when viewed from the front, and a longer side 24a thereof is in contact with and orthogonal to the center axis 21 and the axis 23 of the lens 20.

Figure 9:
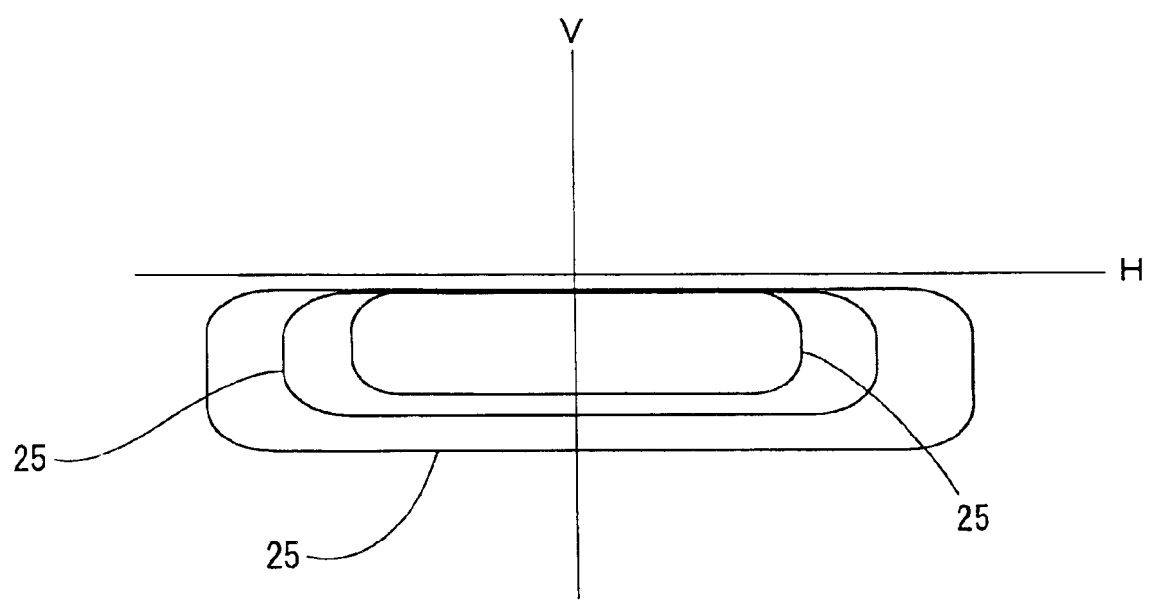
FIG. 9 is an explanatory drawing showing a projected image related to the light-emitting portion.

FIG. 9 schematically shows a projected pattern from the light-emitting portion 24, where a lateral axis "H" is a horizontal line and a vertical axis "V" a vertical line.

The light-emitting portion is made rectangular, which is easiest for forming the light-emitting portion with a horizontally elongated shape. In addition, the light-emitting portion 24 is placed closer to one side of a face which includes the center axis 21 and the axis 23 such that the longer side thereof is in contact with the center axis 21. Accordingly, one of the sides (which corresponds to the longer side 24a) of each of the projected images 25, which are generally rectangular, can be aligned. In a case where a screen is arranged in front of a lamp, with regard to a light ray which passes in the vicinity of the center axis of the lens 20, a horizontally elongated image with little distortion is projected on the screen, and therefore a clear cut line can be formed. Furthermore, by combining a plurality of projected images of such horizontally elongated shapes, a light distribution pattern required for a headlamp can be obtained. For example, in a lamp structure including a light-emitting element for forming a projected pattern having a light-condensing characteristic, a light-emitting element for forming a projected pattern with a diffusive characteristic, and a light-emitting element for forming a cut line, the light distribution can be controlled by synthesizing different projected images for each of the required distribution functions.

It is noted that the size of the projected image can be adjusted by setting the focal distance of the lens, or it can be adjusted by using an external diffusion lens.

The lamp structure in which a plurality of light-emitting elements are used is not limited to a structure where one semiconductor chip is provided in one light-emitting element. That is, a plurality of semiconductor chips can be arranged within a single light-emitting element.

Figure 10:
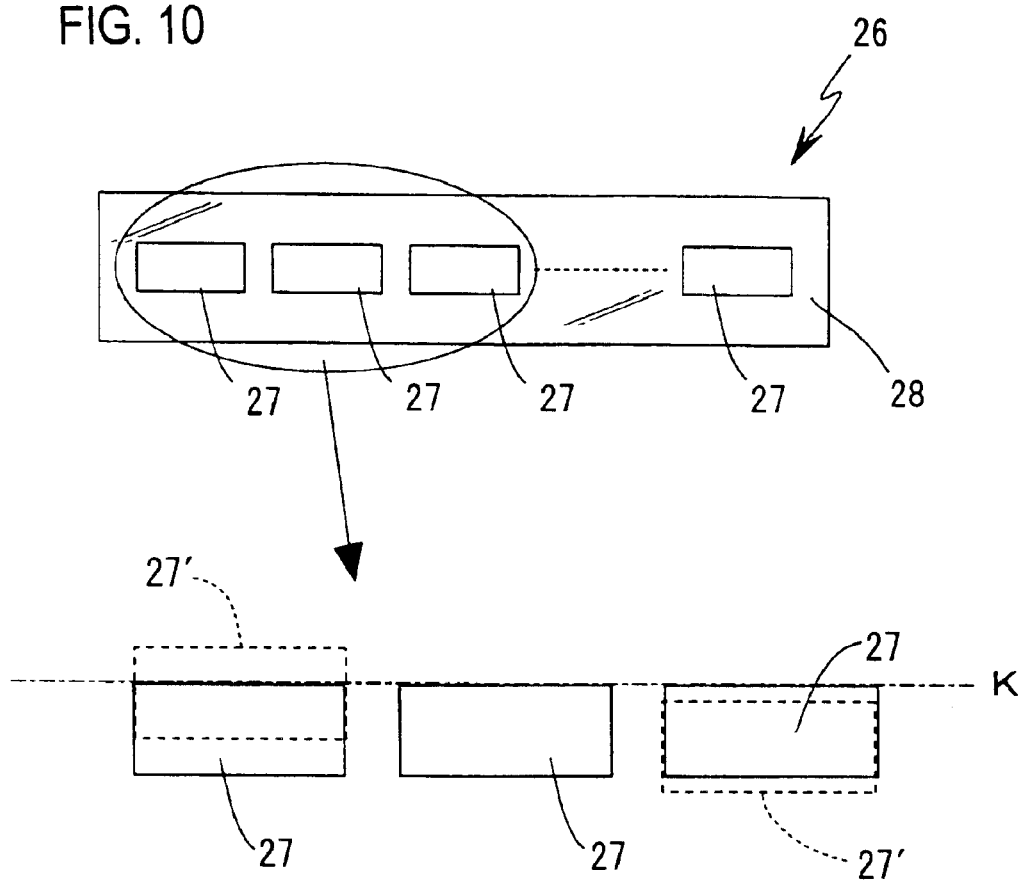
FIG. 10 is an explanatory drawing showing a light-emitting element with a plurality of light-emitting portions.
Figure 11:
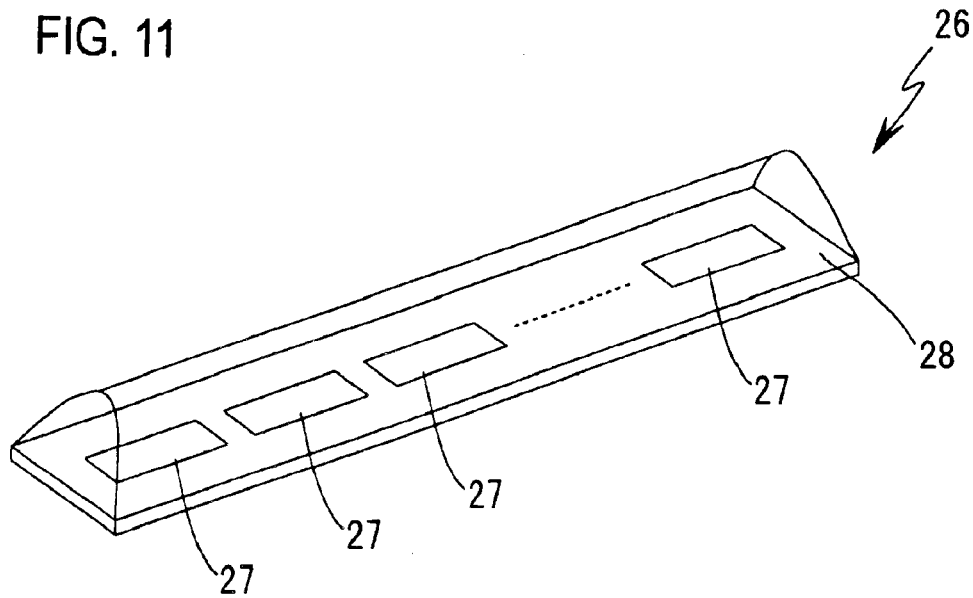
FIG. 11 is a perspective view schematically showing the light-emitting element of FIG. 10.

For example, as shown in FIGS. 10 and 11, a plurality of semiconductor chips 27 are arranged in a straight line within a light-emitting element 26, and these semiconductor chips are covered by a fluorescent body or a transparent member 28 of a semi-cylindrical shape. Otherwise, a transparent member can be arranged in front of a base plate on which the semiconductor chips are mounted.

Compared with the case where a large number of semiconductor chips are arranged on the face of a cylindrical member, this example uses a fluorescent body or a transparent member of a semi-cylindrical shape, thus obtaining such advantages as reduction of the size of the light source and elimination of the need for a special optical system.

In a case where a plurality of semiconductor chips are arranged in the light-emitting portion, if the positional accuracy is low, problems can occur such as misalignment of the projected image and lack of clear formation of a cut line.

For example, as shown in the lower part of FIG. 10, a straight line K, depicted by a single-dashed line, indicates a data line for formation of a cut line. There is generally no problem though if one of the sides of each of the light-emitting portions 27 is aligned with the straight line K. However, it is difficult to appropriately control the light distribution if the light-emitting portions 27' are arranged not aligned with respect to the straight line K, as shown by dashed lines.

Therefore, relative positional errors among the various light-emitting portions within the light-emitting element should preferably not be more than ±0.01 mm. This accuracy is a tenth of the aforementioned ±0.1 mm. However such accuracy is required in order to clearly form the cut line.

An example has been described in which a plurality of light-emitting portions are arranged in a linear direction within the light-emitting element. The invention is not limited to such a structure, but various other arrangements of light-emitting portions can be used, such as a grid-like pattern. In such a case also the relative positional accuracy among the light-emitting portions must be assured.

Figure 12:
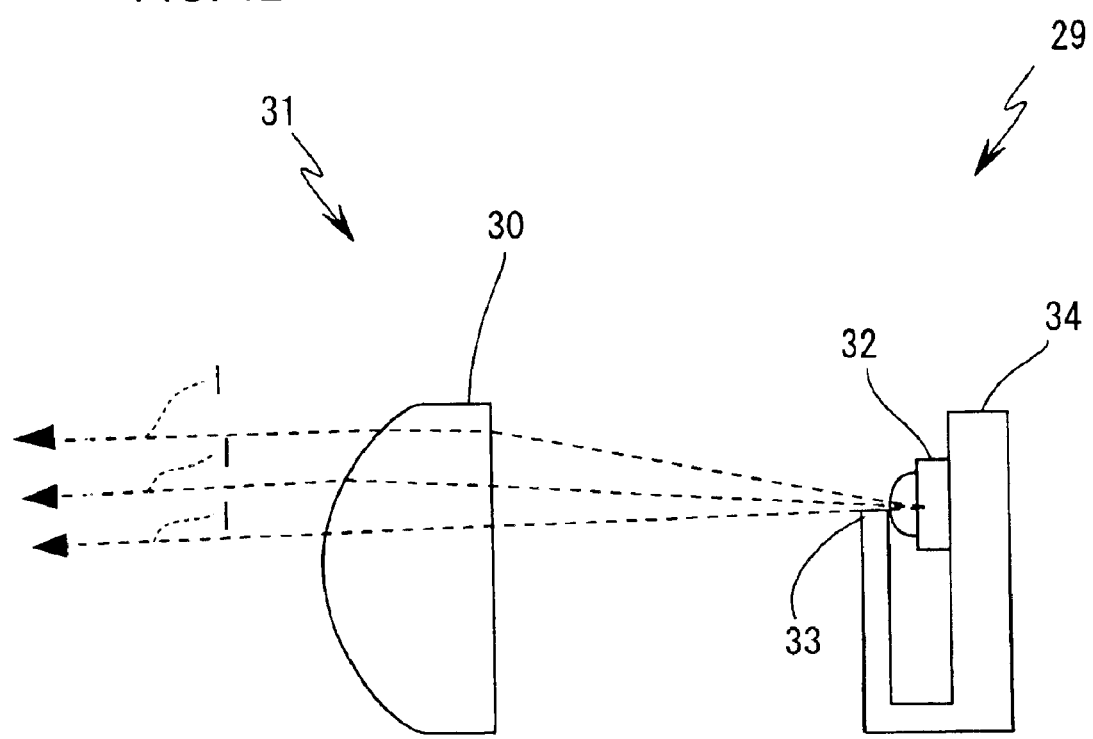
FIG. 12 is an explanatory drawing showing an example of the structure of a headlamp according to the present invention in which direct light from the light-emitting element is employed.
Figure 13:
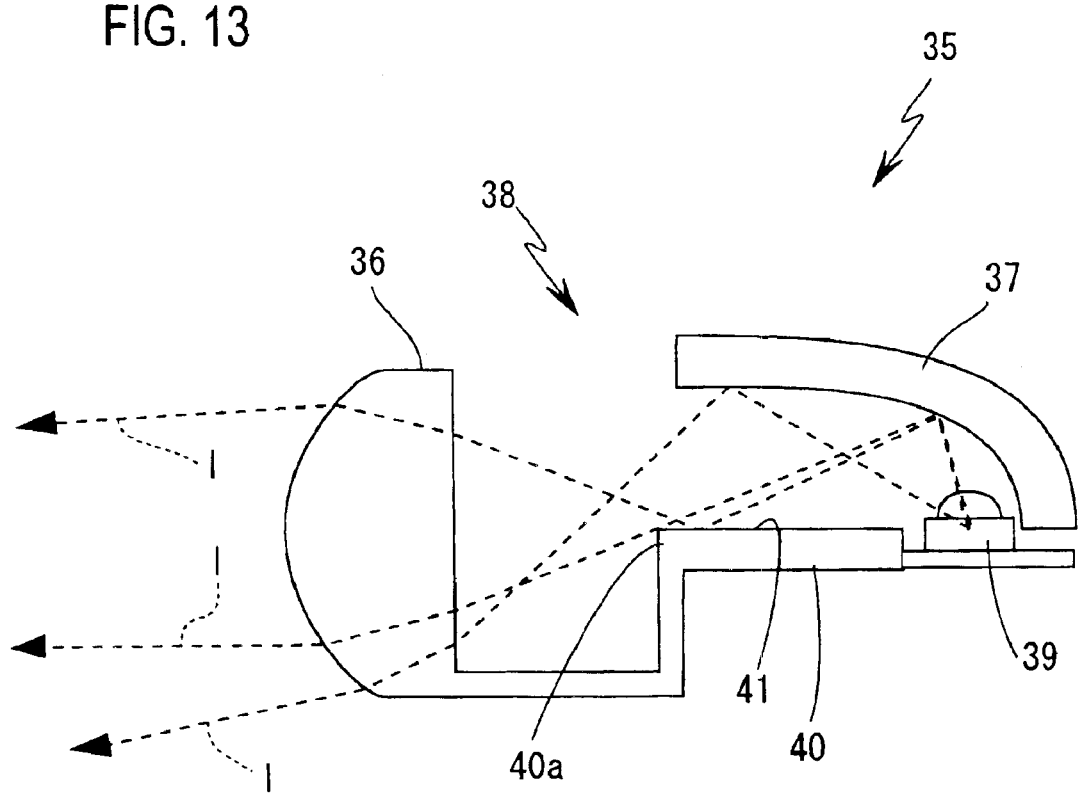
FIG. 13 is an explanatory drawing showing an example of the structure of a headlamp according to the present invention in which reflected light is used.

FIG. 12 and FIG. 13 show schematically a vehicular headlamp constructed according to the present invention, namely, an example of the structure of a light radiating portion of the vehicular headlamp. This headlamp uses a projection-type optical system.

FIG. 12 illustrates a mode in which direct light emitted from a light-emitting element is mainly used, and FIG. 13 a mode in which reflected light, that is, light emitted from a light-emitting element and reflected by a reflector, is mainly used.

In a vehicular headlamp 29 shown in FIG. 12, an optical system 31 including a projection lens 30 (a projection-type optical system) is used. That is, this example includes a light-emitting element 32, a light-shielding member (shade) 33, and the projection lens 30. The light-emitting element 32 and the light-shielding member 33 are mounted on a supporting member 34. The object-side focal point of the projection lens 30 is located adjacent to the upper edge of the light-shielding member 33. It is to be noted that, in a case where a part of light by the light-emitting element 32 is shielded from the upper edge of the light-shielding member 33 and an image thus formed is projected, it is preferable that the upper edge portion of the light-shielding member 33 is placed as closely adjacent as possible to the light-emitting element 32.

The optical axis of the light-emitting element 32 and the optical axis of the lamp are arranged parallel to each other. Light I, which is part of the light emitted from the light-emitting element and directed forward without being shielded by the light-shielding member 33 positioned in front of the light-emitting element, passes through the projection lens 30 to become radiated light. A cut line which determines a contrast boundary in the light distribution pattern is formed by the upper edge of the light-shielding member 33. Furthermore, when the radiation angle of light emitting from the light-emitting element 32 is large, the amount of non-illuminating light, that is, light which does not pass through the projection lens 30 increases. Therefore, the diffusion angle should be set in consideration of the diameter and position of the projection lens.

In a vehicular headlamp 35 as shown in FIG. 13, an optical system 38 including a projection lens 36 and a reflector 37 is used. In other words, this example includes a light-emitting element 39, the reflector 37, and the projection lens 36. The light-emitting element 39 and a supporting member 40 of the projection lens 36 are formed in a crank shape when viewed from the side, and a part thereof is formed as a light-shielding portion 40a. The focal point of the reflector 37 is located on the light-emitting portion of the light-emitting element 39 or closely adjacent thereto. The object-side focal point of the projection lens 36 is set adjacent to the light-shielding portion 40a. The shape of the reflecting surface may be that of an ellipse of rotation, an ellipsoidal-parabolic composite surface, or a freely formed curved surface based on these basic surfaces.

The light-emitting element 39 is mounted on the supporting member 40 with a positional relationship in which the optical axis thereof is orthogonal to the optical axis of the lamp. The greater part of the light emitted by the light-emitting element 39 is reflected by the reflecting surface of the reflector 37. Subsequently, the light I directed forward without being shielded by the light-shielding portion 40a passes through the projection lens 36 to become radiated light. A cut line which determines a contrast boundary in the light distribution pattern is formed by the upper edge of the light-shielding portion 40a. Additionally, a plane reflector 41 is provided between the light-emitting element 39 and the light-shielding portion 40a, and thus the utilization rate of the light flux is increased. By integrally molding the supporting member 40 and the projection lens 36 from a transparent material, an optical system component part can be manufactured with high accuracy with regard to the attachment position of the light-emitting element 39, the position of the upper edge of the light-shielding portion 40a, the focal point position of the projection lens 36, and the like.

High accuracy in the attachment position of the light-emitting element to the supporting member should be assured. A significant error in the data position of a conventional LED not originally intended for use in an automotive headlamp will exert a strongly negative effect on light distribution control.

Consequently, the outer edge of a base plate portion of the light-emitting portion of the light-emitting element is used as the attachment data point of the light-emitting element, that is, the reference line for purposes of attachment, to the supporting member.

Figure 14:
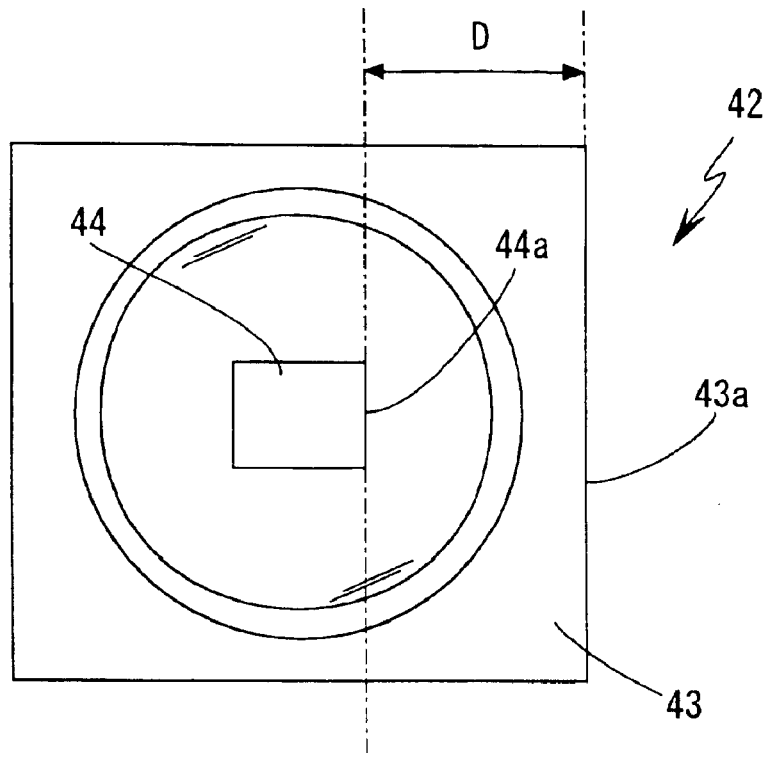
FIG. 14 is an explanatory diagram showing the attachment point of a light-emitting element in a front elevational view in the direction of the optical axis.
Figure 15:
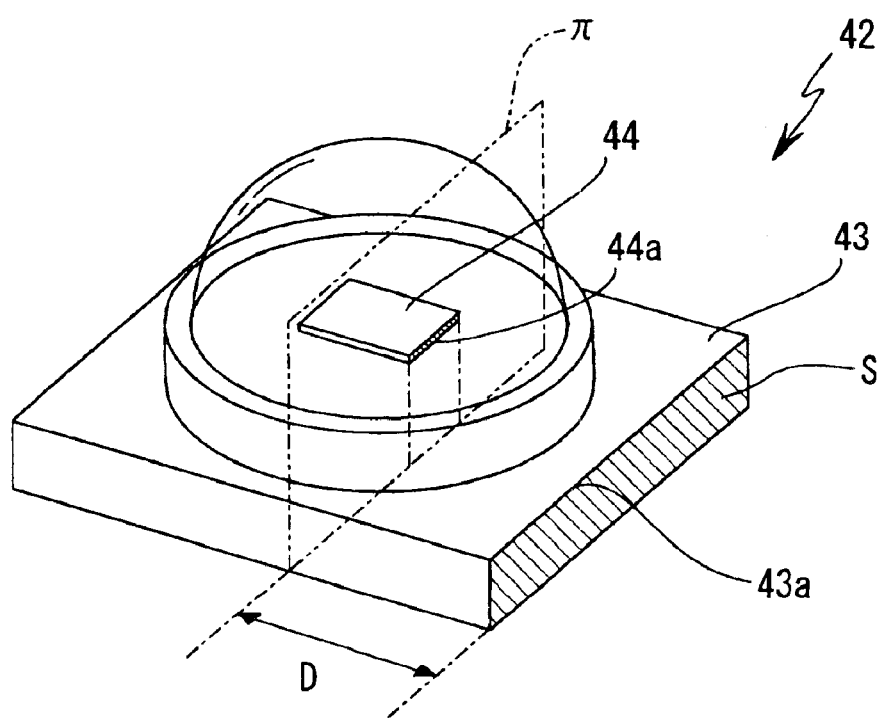
FIG. 15 a perspective view of the same.

FIG. 14 and FIG. 15 show an example 42 of a structure of the light-emitting element. FIG. 14 is a plane top view of the light-emitting element when viewed in the direction of the optical axis. FIG. 15 is a perspective schematic view.

In this example, a data face S (see FIG. 15), which serves as a data point for mechanically positioning the light-emitting element 42, is provided on a side face which includes an outer edge 43a of a base plate portion 43. In other words, a plane that has a rectangular plate shape and which contains one of the sides of the base plate portion 43 and is parallel to the optical axis of the light-emitting element 42 is employed as the data face for positioning. Adequate positioning accuracy is thus assured by aligning the data face with the attachment position (a stepped face, a supporting face or the like) on the supporting member of the light-emitting element (not shown).

Furthermore, a light-emitting portion 44 (for example, a semiconductor chip) has a rectangular shape, and one side 44a of a side edge forms a straight line when viewed in the direction of the optical axis of the light-emitting element 42. In addition, the accuracy in the positional relationship with respect to the aforementioned data face is improved, and thus a data point for optical design and for manufacturing can be obtained. For this purpose, it is preferable that the amount of a relative positional error between the one side 44a and the outer edge 43a of the base plate portion 43 is within 0.01 to 0.1 mm.

For example, the distance between a plane π containing the one side 44a (see FIG. 15) and the data face S is indicated as D. In this case, the reason why the dimensional error is held within ±0.1 mm is, as described above, to make it smaller than the positional error of the light-emitting portion and optical parts such as the reflector. Furthermore, a tighter limit on the dimensional accuracy, such as ±0.01 mm, is not required due to accompanying drawbacks such as manufacturing difficulties and higher costs.

In this manner, the data face for mechanically positioning the light-emitting element is provided in the outer edge portion of the base plate portion, and thus adequate positional accuracy of the light-emitting portion with respect to the data face is obtained. Therefore, the accuracy required for manufacturing and optical design of the headlamp can be sufficiently assured.

Figure 16:
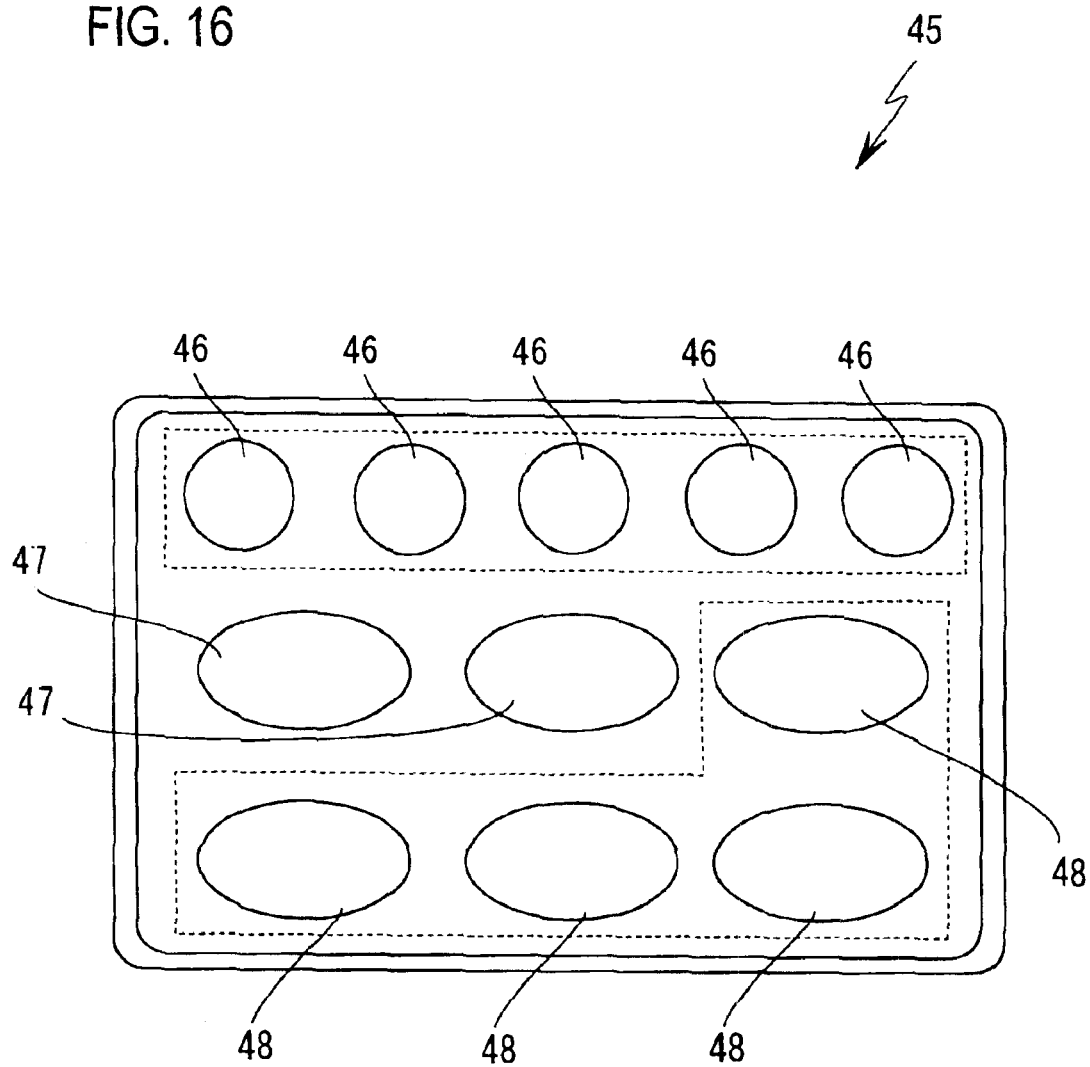
FIG. 16 is a front elevational view showing an example of the structure of a headlamp employing the present invention.

FIG. 16 is a front elevational view showing an example of the structure of a vehicular headlamp 45 in which a plurality of radiation units are combined.

Radiation units 46 arranged in the top level are diffusion types, having a moderate or large horizontal diffusion characteristic as the light distribution function thereof.

The radiation units arranged in the middle and lower level are light-condensing types. Of these radiation units, the radiation units 47 in the middle level radiate a projected pattern which mainly contributes to formation of a cut line. Other radiation units 48 are used for radiating light toward regions at a greater distance from the front of the vehicle, and form a projected pattern which mainly contributes to formation of a so-called hot zone (a high intensity center portion).

Each of these radiation units has a structure as shown in FIG. 13. The shapes of the light-emitting portions of the light-emitting elements are different for each light distribution function, and the focal distance of the reflector, the light-shielding position, the back focus of the projection lens and the like are designed for each individual purpose.

A total of ten or between ten and twenty radiation units are preferable in order to achieve adequate size reduction, cost reduction and the like. Furthermore, it is preferable that approximately two radiation units which contribute to formation of the cut line are arranged in the center of the lamp or in the middle level, approximately two or three radiation units for small diffusion, moderate diffusion, and large diffusion are arranged respectively to the left and right and above and below those units.

Figure 17:
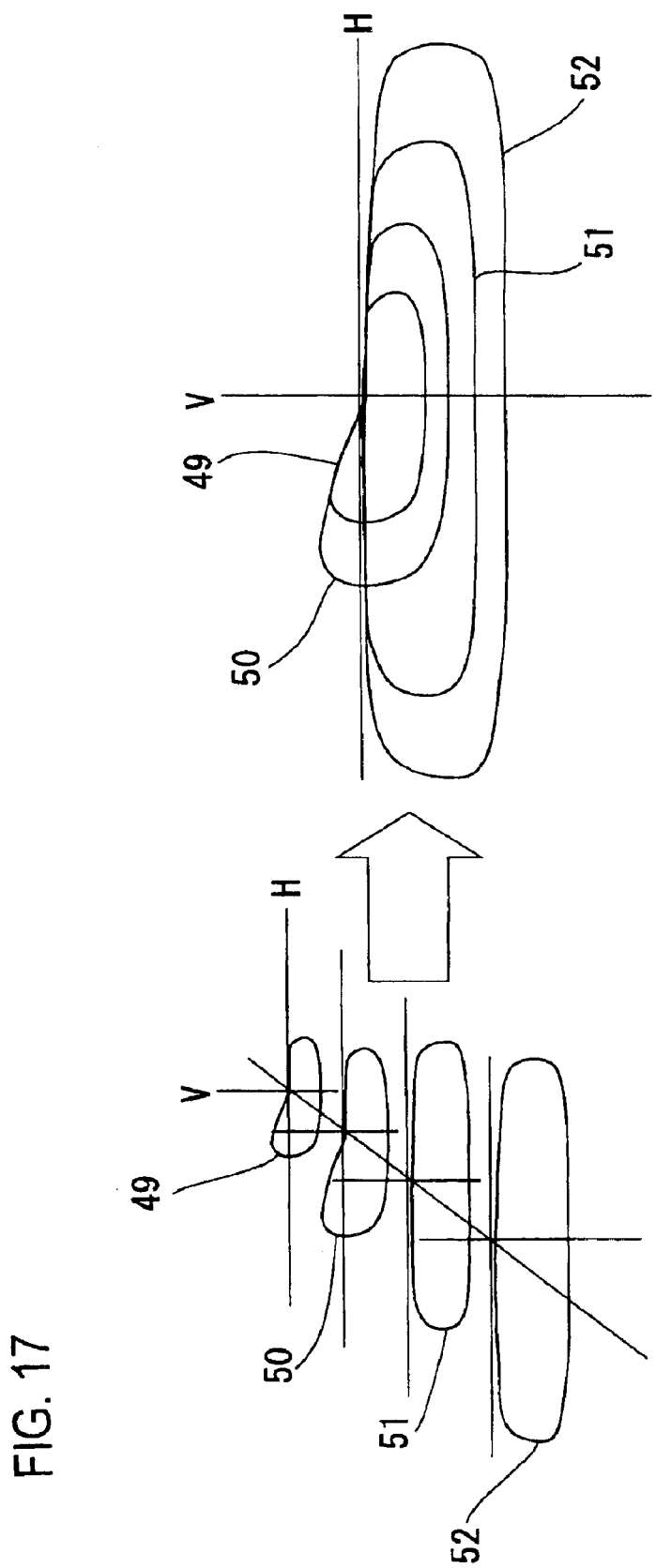
FIG. 17 schematically shows a light distribution pattern produced by the headlamp of FIG. 16.

FIG. 17 schematically shows an example of light distribution pattern formation. The projected patterns for each function are shown separately on the left-hand side of the drawing, and the composite radiation pattern in which all patterns are combined is shown on the right-hand side.

The pattern 49, which has a relatively smaller area, is produced by the radiation unit 48, and the pattern 50 by the radiation unit 47.

Additionally, projected patterns 51, 52 having a horizontally diffusive characteristic are produced by the radiation units 48. The pattern 51 is formed by a radiation unit having a moderate degree diffusive characteristic, and the pattern 52 is formed by a radiation unit having a large diffusive characteristic.

A clear cut line can be formed and the light flux utilization rate can be increased upon combining these projected patterns.

As apparent from the descriptions above, sufficient accuracy for light distribution control can be assured by increasing the dimensional accuracy of the semiconductor chip or the like relative to the positional accuracy of the light-emitting portion with regard to the reflector or the lens. Therefore, deviations in light distribution and in performance of the lamp can be reduced.

A projected pattern appropriate for the light distribution of a vehicular headlamp can be easily obtained by using a generally rectangular pattern, and a cut line in the low-beam light distribution pattern can be clearly formed.

Furthermore, light components which are difficult to control can be prevented from causing glare, and the projected images of each light-emitting portion can be prevented from being irregularly arranged.

Moreover, the positional error of the light-emitting portion with respect to the attachment data point of the light-emitting element is reduced, and therefore accuracy in optical design and for manufacturing can be secured.

It should further be apparent to those skilled in the art that various changes in form and detail of the invention as shown and described above may be made. It is intended that such changes are included within the spirit and scope of the claims appended hereto.

What is claimed is:

1. In a vehicular headlamp comprising a light-emitting element comprising a light-emitting portion and fluorescent body adjacent said light-emitting portion, and an optical system comprising a reflector and a lens, the improvement wherein a focal point of said optical system is located at or closely adjacent said light-emitting portion of said light-emitting element, and wherein a dimensional error in an outer shape of at least one of said reflector and said fluorescent body viewed in the direction of the optical axis of said light-emitting element is not more than 0.1 millimeters, said dimensional error being less than a positional error of said light-emitting portion with respect to said reflector and said lens.

2. The vehicular headlamp according to claim 1, wherein said light-emitting portion when viewed in said direction of said optical axis of said light-emitting element has a shape that is horizontally elongated in a direction orthogonal to said optical axis, and a light source image of said light-emitting portion is primarily enlarged in a horizontal direction by optical system to form a light distribution pattern.

3. The vehicular headlamp according to claim 2, wherein one side of a side edge of said light-emitting portion, when viewed in said direction of said optical axis of said light-emitting element has a straight shape, a projected pattern of said straight shape forming a cut line for a low-beam light distribution pattern.

4. The vehicular headlamp according to claim 3, wherein said light-emitting portion is rectangular viewed in said direction of said optical axis of said light-emitting element, and a longer side of said light-emitting portion is aligned with and orthogonal to a center axis of said lens.

5. In a method for manufacturing a vehicular headlamp comprising a light-emitting element comprising a light-emitting portion and fluorescent body adjacent said light-emitting portion, and an optical system comprising a reflector and a lens which project a light source image of said light-emitting portion in an enlarged manner, a focal point of said optical system being located at or closely adjacent a light-emitting portion of said light-emitting element, the improvement comprising controlling a dimensional error in an outer shape of at least one of said reflector and said fluorescent body viewed in the direction of the optical axis of said light-emitting element to be not more than 0.1 millimeters, said dimensional error being less than a positional error of said light-emitting portion with respect to said reflector and said lens.

6. The method for manufacturing the vehicular headlamp, according to claim 5, wherein said light-emitting element comprises a plurality of light-emitting portions, and wherein a relative positional error between said light-emitting portions and outer boundaries of said light-emitting element is controlled so as to be not more than ±0.01 millimeters.

7. The method for manufacturing a vehicular headlamp, according to claim 6, wherein an outer edge of a base plate portion of said light-emitting portion of said light-emitting element defines an attachment data point of said light-emitting element with respect to a supporting member, one side of a side edge of the light-emitting portion, when viewed in said direction of said optical axis of said light-emitting element, is formed in a straight shape, and a degree of a relative positional error between said one side and said outer edge of the base plate portion is controlled so as to be no more than 0.01 to 0.1 millimeters.

* * * * *